(12) United States Patent
Kuwahara et al.

(10) Patent No.: US 6,498,294 B1
(45) Date of Patent: *Dec. 24, 2002

(54) PACKAGE FOR HIGH FREQUENCY DEVICE

(75) Inventors: Ryo Kuwahara, Yamanashi (JP); Kouichi Iwaida, Yamanashi (JP)

(73) Assignee: Fujitsu Quantum Devices Limited, Yamanashi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/553,079

(22) Filed: Apr. 20, 2000

(30) Foreign Application Priority Data

Apr. 23, 1999 (JP) ............................. 11-116042

(51) Int. Cl.[7] ............................. H01L 23/04
(52) U.S. Cl. ............ 174/52.3; 174/52.4; 257/698; 257/699; 257/708
(58) Field of Search ............ 174/52.1, 52.3, 174/52.4, 50.5, 50.56, 50.61; 257/672, 698, 699, 708, 182; 438/667

(56) References Cited

U.S. PATENT DOCUMENTS 4,614,836 A * 9/1986 Carpenter et al. ............ 174/51
4,713,634 A * 12/1987 Yamamura ................... 333/245
5,175,611 A * 12/1992 Richardson et al. ........ 257/699
5,783,857 A * 7/1998 Ziegner et al. ............. 257/664

FOREIGN PATENT DOCUMENTS

JP          55-85103         6/1980

* cited by examiner

Primary Examiner—Dean A. Reichard
Assistant Examiner—Carmelo Oliva
(74) Attorney, Agent, or Firm—Armstrong, Westerman & Hattori, LLP (57) ABSTRACT

The present invention relates to a package for a high-frequency device, in which the characteristic impedance can be matched while a gap between the casing and each terminal is maintained wide enough to avoid contact. In the package for a high-frequency device, each metallic terminal is hermetically fixed to a conductive casing and is electrically insulated from the conductive casing by glass. Each metallic terminal extends in parallel with a side wall of the conductive casing while it is separated from the side wall. Each metallic terminal is also flanked by a pair of conductive protruding portions that are formed on a side wall of the conductive casing and extend in the longitudinal direction of each metallic terminal. The conductive protruding portions are formed on either side of each metallic terminal and serve to match the characteristic impedance.

7 Claims, 7 Drawing Sheets

PACKAGE FOR HIGH FREQUENCY DEVICE

BACKGROUND OF THE INVENTION

1. Field of the Invention

The present invention generally relates to packages for high-frequency devices, and, more particularly, to a package for a high frequency device that can perform impedance matching around each terminal in a package for a photo detector device such as PIN-PD (PIN photodiode) used for optical communication.

In recent years, as the transmission rates in optical communication have been becoming higher, there has been an increasing demand for packages that perform accurate characteristic impedance matching and accordingly have excellent transfer characteristics and reflection characteristics at high frequency and over a wide area.

Conventionally, a package for a high-frequency device normally uses ceramics as an insulator, because matching the characteristic impedance is relatively easy with ceramics. Since a metal wiring pattern is normally formed on the ceramics by metal plating, the characteristic impedance of signal lines formed by a Au plating film that is much thinner than the insulator can be easily calculated in a so-called parallel-plate-type arrangement.

However, a package using ceramics as an insulator is costly, and, therefore, there has been a demand for inexpensive packages using glass as an insulator. Still, the characteristic impedance needs to be accurately matched in packages using a glass insulator, as in packages using a ceramic insulator.

2. Description of the Related Art

Figure 1:
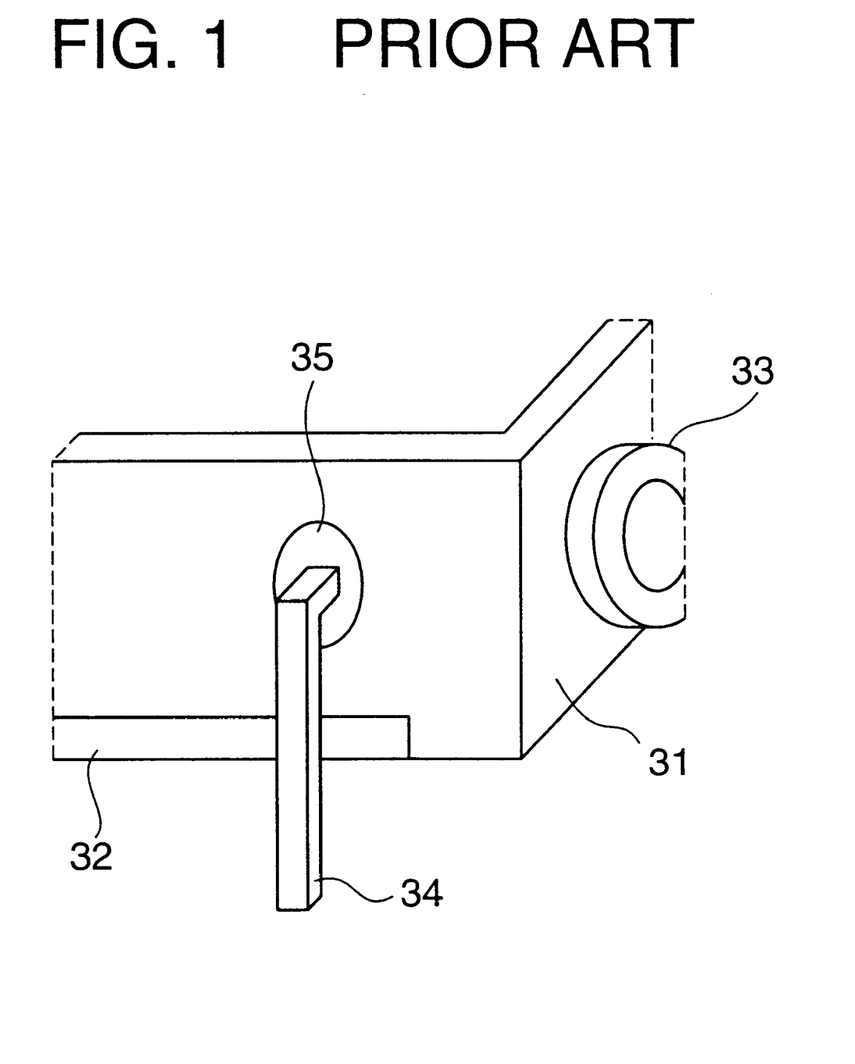
FIG. 1 is a schematic perspective view of a conventional package for a high-frequency device.

FIG. 1 is a schematic perspective view of a package for a high-frequency device provided with glass insulators. In this figure, a metallic terminal 34 is fixed to a side wall of a metallic casing 31 by a glass piece 35, and extends along the side wall of the metallic casing 31 in a dual-in-line arrangement.

Although only one metallic terminal 34 is shown in this figure, a plurality of pairs of metallic terminals are actually fixed to the metallic casing 31. An optical fiber attachment portion 33 through which optical fibers for inputting and outputting light are attached to the metallic casing 31 is also formed on the front wall of the metallic casing 31. The metallic casing 31 is placed and fixed onto a stem 32 for mounting an optical device and peripheral circuits.

However, the above package having glass insulators is not provided with a mechanism for characteristic impedance matching, resulting in poor transfer characteristics and reflection characteristics at high frequency. More specifically, since each of the terminals that function as signal lines is much thicker than an Au plating film, the characteristic impedance can be calculated in the parallel-plate-type arrangement only if the gap between the casing and each terminal is very narrow, for instance, 0.1 mm. However, it is difficult to narrow the gap between the casing and each terminal to 0.1 mm, and matching the characteristic impedance is accordingly difficult. Furthermore, if the gap between the casing and each terminal is narrowed to 0.1 mm, there will be a strong possibility of short-circuiting due to contact between them.

SUMMARY OF THE INVENTION

A general object of the present invention is to provide packages for high-frequency devices, in which the above disadvantages are eliminated.

A more specific object of the present invention is to provide a package for a high-frequency device that performs accurate characteristic impedance matching while maintaining the gap between the casing and each terminal wide enough to avoid contact.

The above objects of the present invention are achieved by a package for a high-frequency device, comprising:

a plurality of metallic terminals that are insulated from a conductive casing by glass and are hermetically fixed to the conductive casing, each of the plurality of metallic terminals extending in parallel with a side wall of the conductive casing and being separated from the side wall; and conductive protruding portions that are formed on either side of each metallic terminal and extend in the longitudinal direction of each metallic terminal, each pair of conductive protruding portions serving to match characteristic impedance.

With the conductive protruding portions that are formed on either side of each metallic terminal and extend in parallel with each metallic terminal, the gap between the conductive casing and each metallic terminal can be made wider than in a conventional package. For instance, the gap between the conductive casing and each metallic terminal can be as wide as 0.5 mm, and the possibility of contact between the conductive casing and each metallic casing can be reduced. Thus, the characteristic impedance can be accurately matched.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 2A:
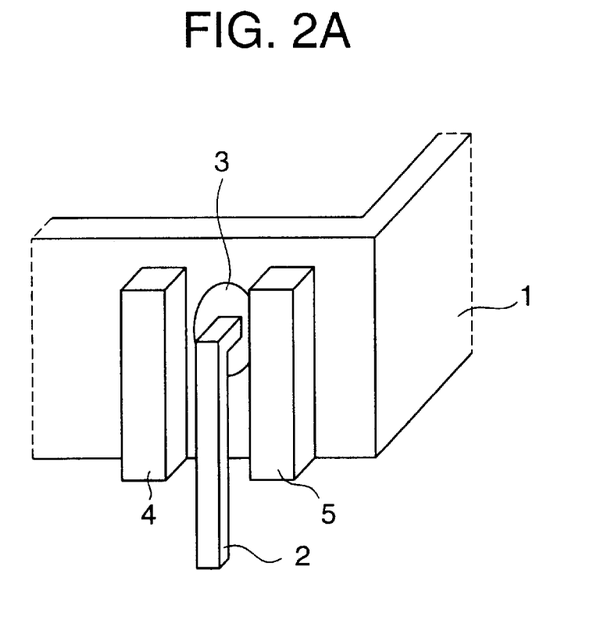
FIGS. 2A and 2B show the principal parts of a package for a high-frequency device of the present invention.
Figure 2B:
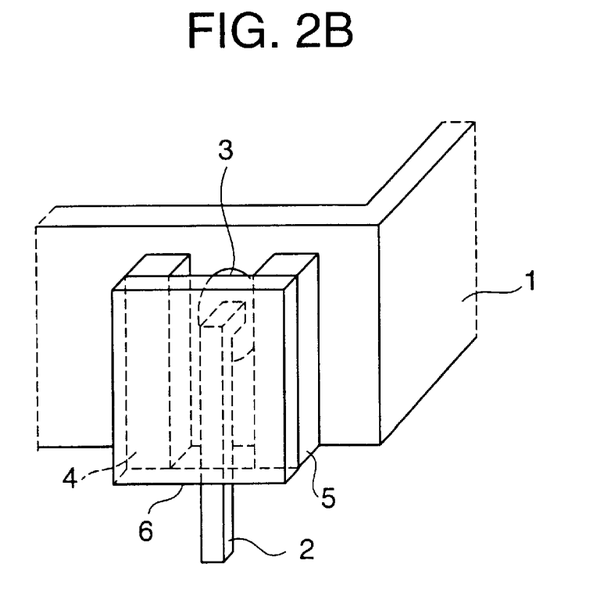

FIGS. 2A and 2B show the principal parts of a package for a high-frequency device of the present invention.

In this package for a high-frequency device, each metal terminal 2 is hermetically fixed to a conductive casing 1, with a glass piece 3 electrically insulating the metal terminal 2 from the conductive casing 1. The metal terminal 2 is flanked by conductive protruding portions 4 and 5 formed on a side wall of the conductive casing 1. The conductive protruding portions 4 and 5 extend in the longitudinal direction of the metal terminal 2, and match the characteristic impedance. The package for a high-frequency device further includes a conductive plate member 6 that covers the metal terminal 2 and is electrically in contact with the conductive protruding portions 4 and 5.

Figure 3A:
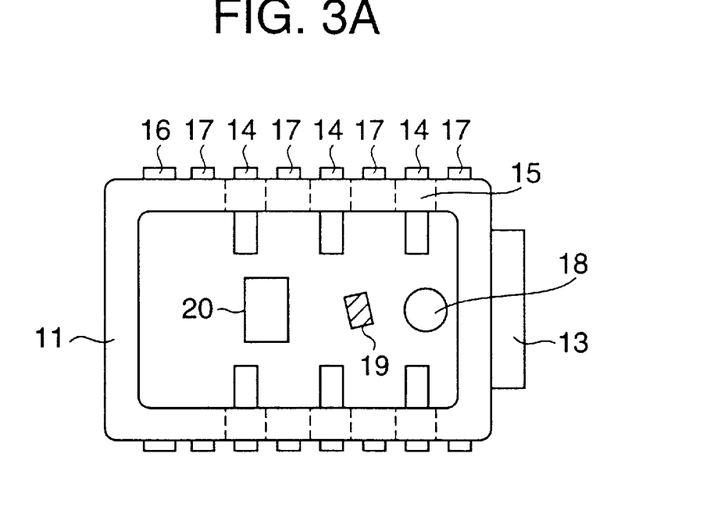
FIG. 3A is a plan view of a first embodiment of the package for a high-frequency device of the present invention.
Figure 3B:
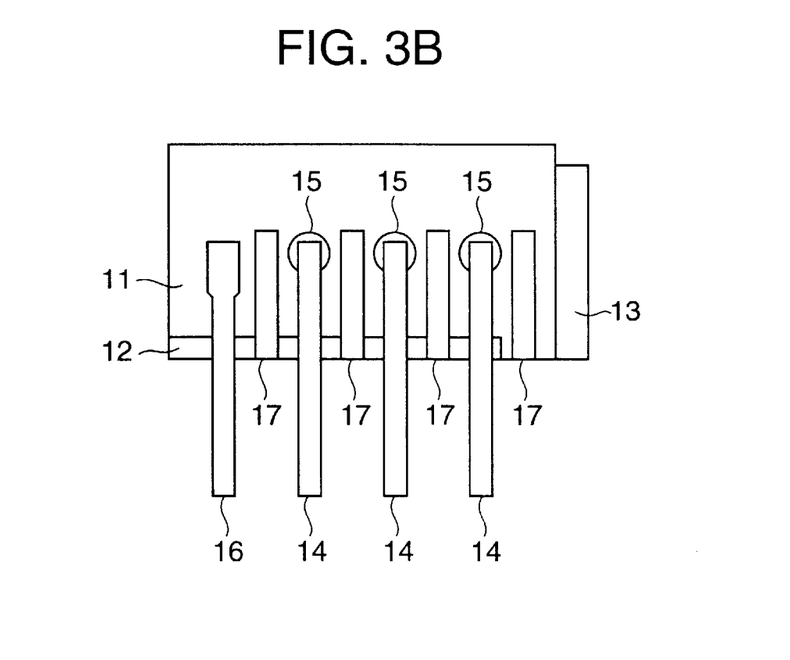
FIG. 3B is a side view of the package for a high-frequency device of FIG. 3A.

FIG. 3A is a plan view of a first embodiment of the package for a high-frequency device of the present invention, and FIG. 3B is a side view of the same.

The package for a high-frequency device of this embodiment includes an optical fiber attachment portion 13 with which optical fibers are attached to a metallic casing 11 made of $Fe_{50}Ni_{50}$, for instance. A plurality of pairs of through holes are formed on the side walls of the metallic casing 11, and a plurality of pairs of metallic protruding portions 17 formed by a grinding technique are interposed between the plurality of pairs of through holes.

Terminals 14 made of KOVAR, for instance, are inserted into the through holes, and are then hermetically sealed by glass pieces 15 made of granulated glass for hermetic sealing containing $Na_2O$, $Al_2O_3$, $B_2O_3$, and $SiO_2$. The terminals fixed by the glass pieces 15 are bent along the side walls of the metallic casing 11 so as to form a dual-in-line configuration.

A pair of ground terminals 16 are welded to the other regions on the side walls of the metallic casing 11.

The metallic casing 11 provided with the terminals 14 and 16 is fixed to a stem 12 to which a semiconductor device is to be mounted.

A round lens 18 is positioned and fixed to the stem 12 by glass, and a PIN-PD 19 and an amplifier circuit 20 for amplifying a light detection output are bonded to the metallic casing 11 by a die bonding technique. The bonding pads of each device are bonded to the terminals 14 by a wire bonding technique.

Although not shown in the figures, a ceramic cap coated with metal film seals the upper surface of the metallic casing 11.

Figure 4:
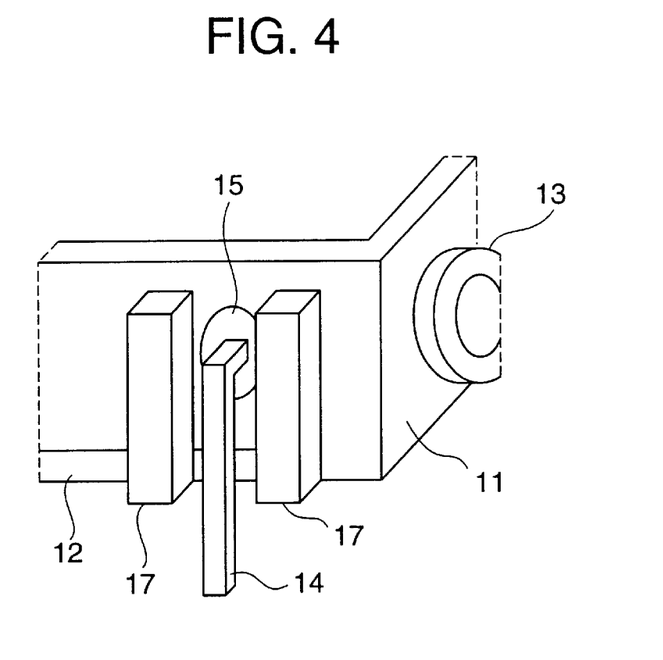
FIG. 4 is a schematic perspective view of the first embodiment of the package for a high-frequency device of the present invention.

FIG. 4 is a schematic perspective view of the first embodiment of the package for a high-frequency device produced in the above-described manner. For ease of drawing, only one of the terminals 14 is shown in this figure.

A pair of metallic protruding portions 17 are formed on either side of the terminal 14, so that the terminal 14 is surrounded by the metallic casing 11 and the pair of metallic protruding portions 17. Even if the gap between the terminal 14 and the metallic casing 11 is made as wide as 0.5 mm, the characteristic impedance can be easily matched.

Since the pair of metallic protruding portions 17 are formed on either side of the terminal 14 in the first embodiment of the present invention, the characteristic impedance can be easily matched, with a reduced possibility of contact. Thus, an inexpensive glass insulating package that excels in transfer characteristics and reflection characteristics can be obtained.

Figure 5:
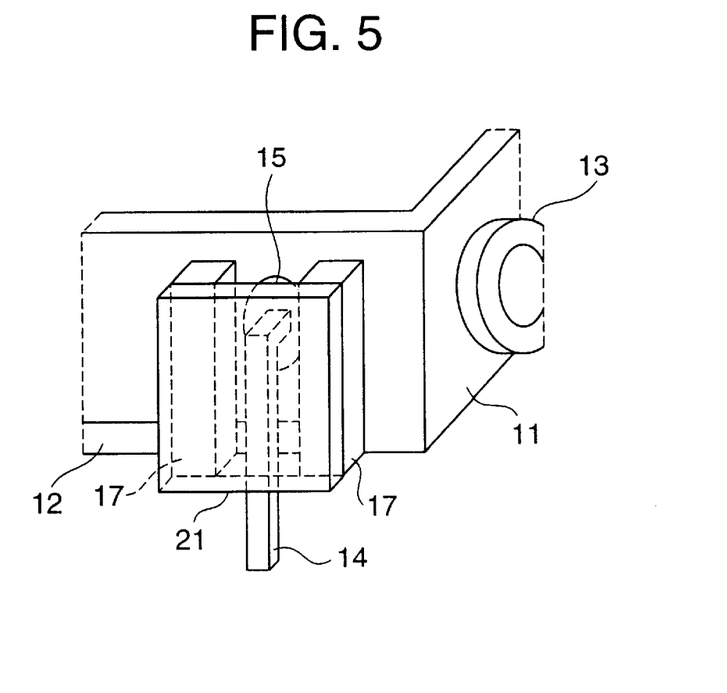
FIG. 5 is a schematic perspective view of a second embodiment of the package for a high-frequency device of the present invention.

FIG. 5 is a schematic perspective view of a second embodiment of the package for a high-frequency device of the present invention. The configuration of the second embodiment is the same as that of the first embodiment, except for a metal plate 21.

In FIG. 5, the pair of protruding portions 17 are formed on either side of the terminal 14, and the metal plate 21 is soldered to the pair of metallic protruding portions 17 so as to bridge the gap between the metallic protruding portions 17. By the soldering, the metal plate 21 becomes equal to the metallic protruding portions 17 and the metallic casing 11 in terms of electric potential.

Since the metal plate 21 bridges the gap between the metallic protruding portions 17 in the second embodiment, the terminal 14 is surrounded by the metallic casing 11, the pair of metallic protruding portions 17, and the metal plate 21, all having the same electric potential. Accordingly, matching the characteristic impedance is easier in the second embodiment than in the first embodiment.

However, the second embodiment has the disadvantage that it requires a greater number of components and is larger in size, compared with the first embodiment. Also, a greater number of production steps are required in the second embodiment.

Figure 6:
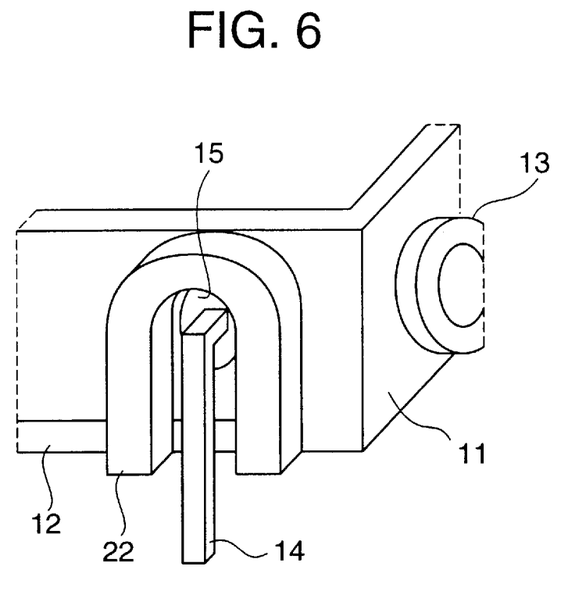
FIG. 6 is a schematic perspective view of a third embodiment of the package for a high-frequency device of the present invention.

FIG. 6 is a schematic perspective view of a third embodiment of the package for a high-frequency device of the present invention. The configuration of the third embodiment is the same as that of the first embodiment, except for the shape of the metallic protruding portion.

In FIG. 6, a U-shaped metallic protruding portion 22 that extends on either side of the terminal 14 and surrounds the fixed portion by the glass piece 15 is formed by a grinding technique.

Since the U-shaped protruding portion 22 surrounds the glass fixed portion of the terminal 14 in the third embodiment, matching the characteristic impedance is easier in the third embodiment than in the first embodiment.

However, the third embodiment has the disadvantage that the package is larger in size and the grinding process is more troublesome due to the complicated shape of the metallic protruding portion.

As it is in the second embodiment, a metal plate may be soldered to the U-shaped metallic protruding portion 22 in the third embodiment. By doing so, the characteristic impedance can be more accurately matched.

Figure 7:
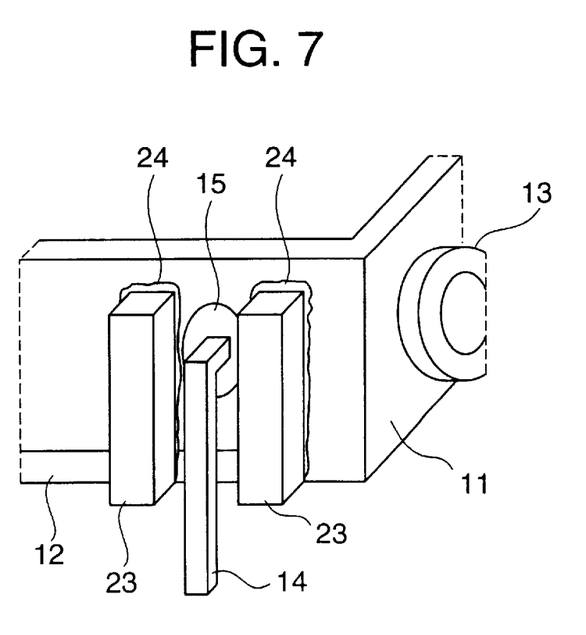
FIG. 7 is a schematic perspective view of a fourth embodiment of the package for a high-frequency device of the present invention.

FIG. 7 is a schematic perspective view of a fourth embodiment of the package for a high-frequency device of the present invention. The configuration of the fourth embodiment is the same as that of the first embodiment, except for the process of forming the metallic protruding portions as independent metallic blocks and then soldering them to the metallic casing.

In the fourth embodiment, metallic blocks 23 made of the same material as the metallic casing 11 and the terminal 14 are independently formed, and soldered, with soldering material 24, to either side of the terminal 14 fixed to a side wall of the metallic casing 11 with the glass piece 15. Here, via the soldering material 24, the metallic blocks 23 become equal to the metallic casing 11 in terms of electric potential.

Since the metallic protruding portions are formed as the independent metallic blocks 23 in the fourth embodiment, the metallic protruding portions can be soldered to the terminal 14 while they are positioned to match the characteristic impedance by measuring the characteristic impedance of the terminal 14. The positioning of the metallic protruding portions is carried out after the PIN-PD and the amplifier circuit are bonded to the stem 12 by a die bonding technique, and the bonding pads of each device are bonded to the terminal 14 by a wire bonding technique. Thus, matching the characteristic impedance can be more accurately carried out in the fourth embodiment than in the first embodiment.

As it is in the second embodiment, a metal plate may be soldered to the pair of metallic blocks 23 in the fourth embodiment. By doing so, the characteristic impedance can be more accurately matched.

Figure 8:
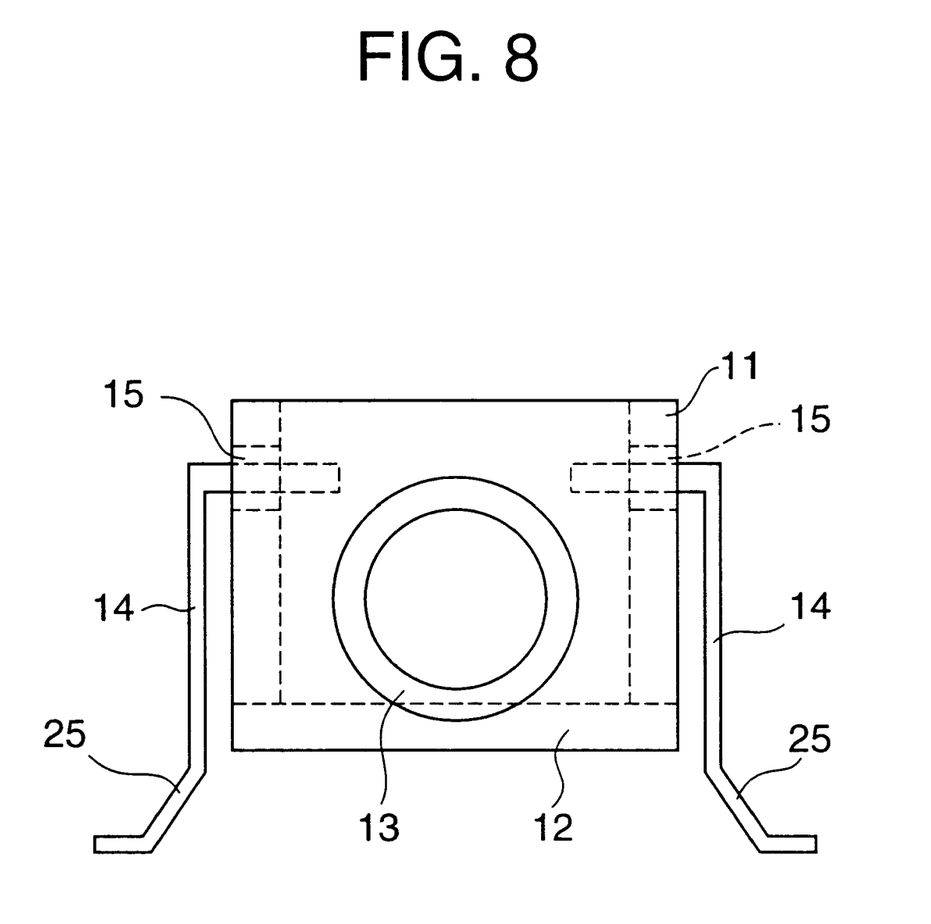
FIG. 8 is a schematic front view of a fifth embodiment of the package for a high-frequency device of the present invention.

FIG. 8 is a schematic front view of a fifth embodiment of the package for a high-frequency device of the present invention. The configuration of the fifth embodiment is the same as that of the first embodiment, except for each terminal 14 being bent in a gull shape.

As shown in FIG. 8, each terminal 14 is fixed to a side wall of the metallic casing 11 with a glass piece 15, and is bent vertically downward. The opposite end to the glass fixed portion of each terminal 14 is bent outward and formed into a gull-shaped portion 25. Although not shown in the figure, metallic protruding portions are also formed on either side of each terminal 14.

Since each terminal is formed in a gull shape, the package for a high-frequency device can be directly bonded to the conductive pads of a printed wiring board or a panel by soldering the flat portion of each gull-shaped portion 25 to the conductive pads, without using through holes.

The gull-shaped terminal 14 can be applied to the foregoing embodiments and modifications.

Figure 9A:
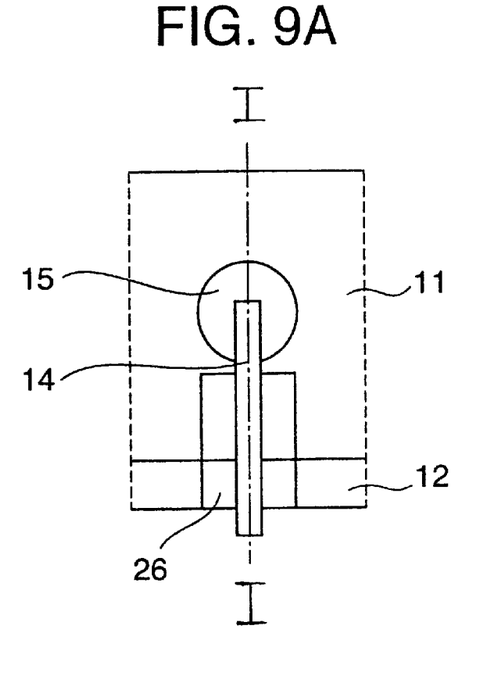
FIG. 9A illustrates a sixth embodiment of the package for a high-frequency device of the present invention.
Figure 9B:
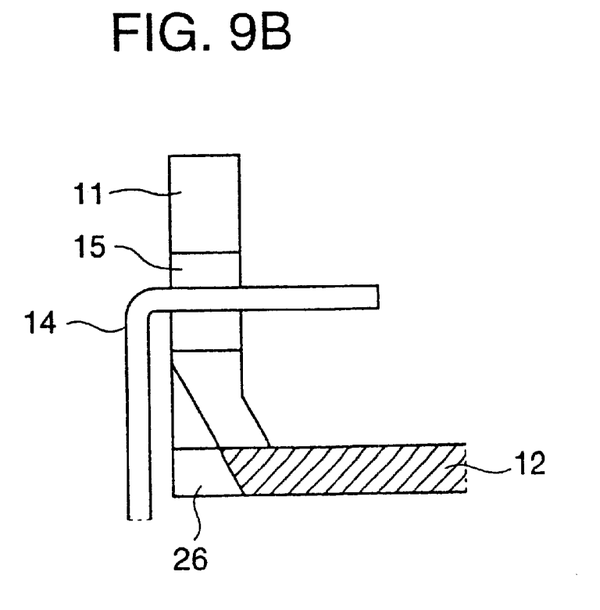
FIG. 9B is a cross-sectional view of the package for a high-frequency device taken along the line I—I of FIG. 9A.

FIG. 9A is a partial side view of a sixth embodiment of the package for a high-frequency device of the present invention, and FIG. 9B is a schematic sectional view of the package for a high-frequency device taken along the line I—I of FIG. 9A.

In the sixth embodiment, an inclined surface groove 26 is formed on the side wall of the metallic casing 11 and the stem 12 including the region corresponding to each terminal 14. As it is in the first embodiment, each terminal 14 is fixed to a side wall of the metallic casing 11 with a glass piece 15 in the sixth embodiment.

Since each inclined surface groove 26 is located near the lower part of each corresponding terminal 14, the side end surfaces of each inclined surface groove 26 function as metallic protruding portions when the terminal 14 is bent inward. Thus, the side end surfaces of each inclined surface groove 26 improve the matching of the characteristic impedance.

In the sixth embodiment, metallic protruding portions, metallic blocks, or a U-shaped metallic block can be formed along each inclined surface groove 26, together with a metal plate. By doing so, the same effects as in the foregoing embodiments can be obtained even if each terminal 14 is not bent inward.

Other various modifications can be made to the foregoing embodiment. In the first embodiment, for instance, the metallic protruding portions 17 can be formed by a metal molding method such as an MIM (Metal Injection Mold) technique or a stamping technique, instead of the grinding technique. In any one of the second through fourth embodiments, the metal plate 21 and the metallic blocks may be fixed by welding, instead of soldering.

In the foregoing embodiments, a PIN-PD is used as a high-frequency device. However, the present invention can be applied to other types of photodiodes or semiconductor laser diodes (LD). The package for a high-frequency device of the present invention can be used as a package for a PD or LD, or as a package to which an LD and a drive circuit are mounted or a PD and an amplifier circuit are mounted, for example.

Also in the foregoing embodiments, the casing, the protruding portions and the plate member are made of metal. However, a non-metallic conductive material, such as conductive plastic, can be used for the casing, the protruding portions and the plate member, as long as it has excellent conductivity.

The package for a high-frequency device of the present invention can also be used as a package to which a high-frequency semiconductor device, such as HEMT (High Electron Mobility Transistor) or HBT (Heterojunction Bipolar Transistor), is mounted, instead of a semiconductor optical device such as a PD or an LD.

The present invention is not limited to the specifically disclosed embodiments, but variations and modifications may be made without departing from the scope of the present invention.

The present application is based on Japanese priority application No. 11-116042, filed on Apr. 23, 1999, the entire contents of which are hereby incorporated by reference.

What is claimed is:

1. A package for a high-frequency device, comprising:
   a plurality of metallic terminals that are insulated from a conductive casing by glass and are hermetically fixed to the conductive casing by glass, each of the plurality of metallic terminals extending outward from said casing then downward in parallel with a side wall of the conductive casing and being separated from the side wall; and
   a conductive U-shaped protruding portion having a base portion and leg portions, said protruding portion formed on either side of each metallic terminal with said leg portions extending out from said base portion in the longitudinal direction of each downward extending portion of said metallic terminal, each of the conductive U-shaped protruding portions being separated from said metallic terminal and surrounding the glass-fixed portion of said metallic terminal extending outward from the conductive casing, and each of the conductive U-shaped protruding portions serving to match characteristic impedance.

2. The package for a high-frequency device as claimed in claim 1, wherein the conductive protruding portions are constituted by conductive blocks that are produced independently of the conductive casing.

3. The package for a high-frequency device as claimed in claim 1, wherein the conductive protruding portions are integrally formed with the conductive casing.

4. The package for a high-frequency device as claimed in claim 1, wherein each of the metallic terminals is bent outward.

5. The package for a high-frequency device as claimed in claim 1, wherein the high-frequency device is a semiconductor optical device, and the conductive casing is a metallic casing.

6. A package for a high-frequency device, comprising:
   a plurality of metallic terminals that are insulated from a conductive casing by glass and are hermetically fixed to the conductive casing, each of the plurality of metallic terminals extending in parallel with a side wall of the conductive casing and being separated from the side wall;
   conductive protruding portions that are formed on either side of each metallic terminal and extend in the longitudinal direction of each metallic terminal, each pair of conductive protruding portions serving to match characteristic impedance, and
   conductive plate members that are electrically in contact with the conductive protruding portions and cover each of the metallic terminals.

7. A package for a high-frequency device, comprising:

a plurality of metallic terminals that are insulated from a conductive casing by glass and are hermetically fixed to the conductive casing, each of the plurality of metallic terminals extending in parallel with a side wall of the conductive casing and being separated from the side wall; and conductive protruding portions that are formed on either side of each metallic terminal and extend in the longitudinal direction of each metallic terminal, each pair of conductive protruding portions serving to match characteristic impedance;

wherein an inwardly inclined concave portion is formed at each location on lower regions of side walls of the conductive casing facing the metallic terminals.

* * * * *